(12) United States Patent
Siddiquie et al.

(10) Patent No.: US 8,884,630 B2
(45) Date of Patent: Nov. 11, 2014

(54) ACTIVE PIN CONNECTION MONITORING SYSTEM AND METHOD

(75) Inventors: Adnan A. Siddiquie, Houston, TX (US); Fangyong Dai, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 394 days.

(21) Appl. No.: 13/258,472

(22) PCT Filed: Jul. 24, 2009

(86) PCT No.: PCT/US2009/051637
§ 371 (c)(1),
(2), (4) Date: Sep. 22, 2011

(87) PCT Pub. No.: WO2011/011013
PCT Pub. Date: Jan. 27, 2011

(65) Prior Publication Data
US 2012/0032684 A1    Feb. 9, 2012

(51) Int. Cl.
*G01R 31/04* (2006.01)
*G01R 31/12* (2006.01)
*H01L 23/00* (2006.01)
*G01R 31/02* (2006.01)

(52) U.S. Cl.
CPC ....... *G01R 31/046* (2013.01); *H01L 2924/1433* (2013.01); *H01L 2924/01079* (2013.01); *H01L 2924/01014* (2013.01); *H01L 2224/48091* (2013.01); *H01L 24/45* (2013.01); *H01L 2224/48227* (2013.01); *H01L 2924/15311* (2013.01); *H01L 2224/45144* (2013.01); *G01R 31/026* (2013.01); *H01L 2924/14* (2013.01)

USPC ............... 324/538; 324/762.02; 324/762.03; 257/48; 438/18

(58) Field of Classification Search
CPC ....... G01R 31/04; G01R 31/045; G01R 31/12
USPC ............ 324/750.3, 762.01–762.05, 537–538; 257/48; 438/18
See application file for complete search history.

(56) References Cited

U.S. PATENT DOCUMENTS

| 5,889,210 A | 3/1999 | Inoue |
| 5,936,417 A * | 8/1999 | Nagata ..................... 324/754.03 |
| 6,452,502 B1 | 9/2002 | Dishongh |
| 6,564,986 B1 | 5/2003 | Hsieh |
| 6,597,187 B2 | 7/2003 | Eldridge et al. |

(Continued)

FOREIGN PATENT DOCUMENTS

JP        2004-193300        7/2004

OTHER PUBLICATIONS

Chinese Office Action cited in Appl, No. 200980160633.6 mailed Feb. 8, 2014; 6 pages.

*Primary Examiner* — Jermele M Hollington
*Assistant Examiner* — Emily Chan
(74) *Attorney, Agent, or Firm* — Nathan Rieth

(57) ABSTRACT

A system for monitoring a connection to an active pin of an integrated circuit (IC) die, includes an input/output (I/O) cell of an IC die, where the I/O cell is bonded to a bonding pad on a ball grid array (BGA) substrate. The system includes a test point on a printed circuit board (PCB) coupled to the bonding pad which forms an electrical/conductive pathway between the test point and the I/O cell. The system includes a clock waveform injected through a resistor into the test point.

17 Claims, 6 Drawing Sheets

(56) References Cited

U.S. PATENT DOCUMENTS

| | | |
|---|---|---|
| 6,801,050 B2 * | 10/2004 | Takechi et al. ........... 324/754.07 |
| 7,394,273 B2 | 7/2008 | Hsu et al. |
| 2002/0081755 A1 | 6/2002 | Degani |
| 2002/0171446 A1 | 11/2002 | Takechi |
| 2006/0194353 A1 | 8/2006 | Spuhler |
| 2008/0303124 A1 | 12/2008 | Khan |
| 2010/0090710 A1 * | 4/2010 | Tsukagoshi et al. .......... 324/612 |
| 2012/0001642 A1 * | 1/2012 | Sylvester et al. ............. 324/538 |

\* cited by examiner ically, the detection of connection failures to the active/functional pins of an IC die in a printed circuit assembly is an important diagnostic tool that can help prevent a significant cause of failure in printed circuit boards in the field (e.g., notebook computer motherboards, etc.). However, the detection of cracked solder joints and other pin connection failures is somewhat difficult in a functional system, especially where the failure in intermittent. Embodiments of the present disclosure overcome difficulties in detecting connection failures to active/functional pins on an IC die.

ACTIVE PIN CONNECTION MONITORING SYSTEM AND METHOD

BACKGROUND

Integrated circuits are produced in large numbers on single wafers of semiconducting material such as silicon. A wafer is cut into many pieces, each of which contains an integrated circuit (IC) and each of which is called a die. An integrated circuit die is typically mounted to a carrier substrate such as a ball grid array (BGA) through wire bonding or flip-chip mounting. In wire bonding, small pads on the IC die are attached to the BGA, for example, with small wires soldered or welded at one end to an IC die pad and at the other end to a BGA pad or connection point. In flip-chip mounting, an IC die is configured as a flip-chip with pre-processed bond pads on which solder bumps are typically formed, enabling the face-down attachment of the flip-chip to the BGA pads or connection points through, for example, ultrasonic or reflow solder processes.

Ball grid arrays (BGAs) are often used on high pin-count application specific integrated circuits (ASICs) and they comprise beads of solder between two generally circular pads for attaching the integrated circuit to a printed circuit board (PCB). Various stresses such as transportation vibration and cyclical mechanical and thermal loading on the BGA substrate, the PCB, and/or the IC die itself can cause solder joints to crack, thereby causing various pins of the integrated circuit to become detached or otherwise loosened from the PCB. These pin connection failures typically occur in the solder ball joints between the BGA and the PCB, but they can also occur in the solder joints between the IC die and the BGA for both wire-bonded and flip-chip mounted configurations.

In order to reduce the pin connection failures associated with cracked solder ball joints, corner balls of a BGA are sometimes replaced with dummy balls that are not used by active (i.e. functional) pins of the integrated circuit. Thus, if the corner dummy balls become cracked, loosened, or otherwise damaged, performance of the integrated circuit is not compromised. However, damage is not necessarily limited to the corner solder ball joints. For example, although a cracked solder ball joint may initially occur at the corner of the BGA, the cracking condition tends to propagate inward toward the center of the BGA, thereby compromising non-dummy solder ball locations associated with active pins of the integrated circuit. Furthermore, damage may also occur in other solder joints associated with active pins of the integrated circuit, such as in wire-bond and flip-chip solder joints.

BRIEF DESCRIPTION OF THE DRAWINGS

The present embodiments will now be described, by way of example, with reference to the accompanying drawings, in which.

DETAILED DESCRIPTION

Overview of Problem and Solution

Figure 1:
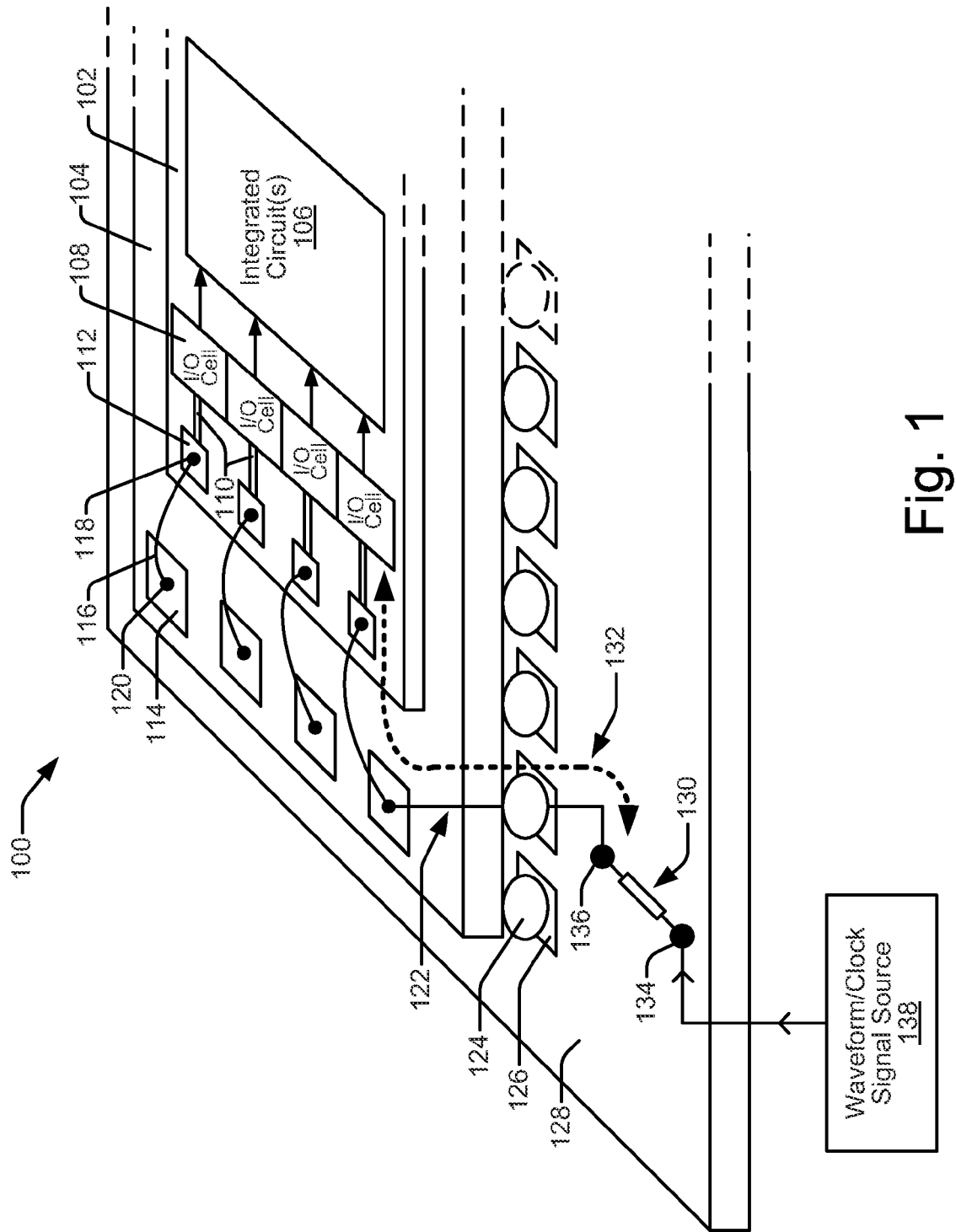
FIG. 1 shows an example of an active pin monitoring system according to an embodiment.

As noted above, a connection failure to a pin of an integrated circuit on a die is often the result of a cracked solder ball joint between the BGA and the PCB caused by stresses such as transportation vibration and other mechanical and thermal loading on the BGA substrate. Other potential causes of connection failures include, but are not limited to, broken wire bonds between the BGA and IC die pads, and damage or cracks to other solder joints coupling the IC die to the BGA.

One approach for dealing with this connection failure problem has been to sacrifice one or more solder ball joints in high stress areas of the BGA, such as at the corners. Sacrificial solder ball joints add mechanical stability to the printed circuit assembly while not impacting IC functionality when they are cracked because they are not associated with active pins on the IC die.

However, cracked solder joints and pin connection failures in general, can occur in places other than high-stress areas of the BGA. Such failures impact active (i.e., functional) pins on the IC die and often result in reduced or failed performance of the integrated circuit. Accordingly, the detection of connection failures (e.g., cracked solder joints, etc.) to the active/functional pins of an IC die in a printed circuit assembly is an important diagnostic tool that can help prevent a significant cause of failure in printed circuit boards in the field (e.g., notebook computer motherboards, etc.). However, the detection of cracked solder joints and other pin connection failures is somewhat difficult in a functional system, especially where the failure in intermittent. Embodiments of the present disclosure overcome difficulties in detecting connection failures to active/functional pins on an IC die.

In one embodiment, for example, a system for monitoring a connection to an active pin of an IC die includes an I/O cell of the IC bonded to a bonding pad on a BGA substrate. A test point on a printed circuit board (PCB) is coupled to the bonding pad and forms an electrically conductive pathway between the test point and the I/O cell. A clock waveform is injected through a resistor into the test point.

In another embodiment, a method of monitoring a connection to an active pin of an integrated circuit die includes injecting a first waveform such as a clock signal through a resistor onto an electrically conductive path associated with an input/output (I/O) cell of the active pin. The injecting includes injecting the first waveform at a first pin of the resistor while having a second pin of the resistor coupled to the conductive path. The first waveform injected at the first pin is monitored and a second waveform at the second pin is monitored. The first and second waveforms are compared, and a determination is made that there is a break in the conductive path when the second waveform is substantially the same as the first waveform.

In another embodiment, a method of monitoring a connection to an active pin of an integrated circuit die includes injecting a first waveform such as a clock signal through a resistor onto an electrically conductive path associated with an input/output (I/O) cell of the active pin. The injecting includes injecting the first waveform at a first pin of the resistor while having a second pin of the resistor coupled to the conductive path. A second waveform at the second pin of the resistor is monitored and compared to a predetermined waveform simulated according to known electrical characteristics of the I/O cell. A determination is made that there is a break in the conductive path when the second waveform is not substantially the same as the predetermined waveform.

Illustrative Embodiments

FIG. 1 shows an example of an active pin monitoring system 100. The system 100 is implemented on a printed circuit assembly (PCA) where an IC die 102 is attached to a package substrate 104. In the embodiment shown, substrate 104 is a Ball Grid Array (BGA) substrate. However, other types of package substrates may be utilized. The IC die 102 includes one or more integrated circuits 106, input/output buffers (I/O cells) 108, and active pins 110. Toward the edges of the IC die 102 are die pads 112 for coupling active pins 110 to BGA bond pads 114 on the BGA substrate 104 through bond wires 116. Each die pad 112 is coupled to an active input/output pin 110, and each die pad 112 is a signal pad for carrying I/O signals to and/or from IC die 102 via its corresponding active pin 110. It should be noted that the die pads 112 shown in FIG. 1 are for purposes of illustration only and they are not intended to indicate the actual number, size or placement of signal pads that would typically be present on an IC die. In addition, although not shown in FIG. 1, power supply pads would also generally be present for coupling IC die 102 to power and ground pads located on a substrate such as BGA 104.

Figure 2:
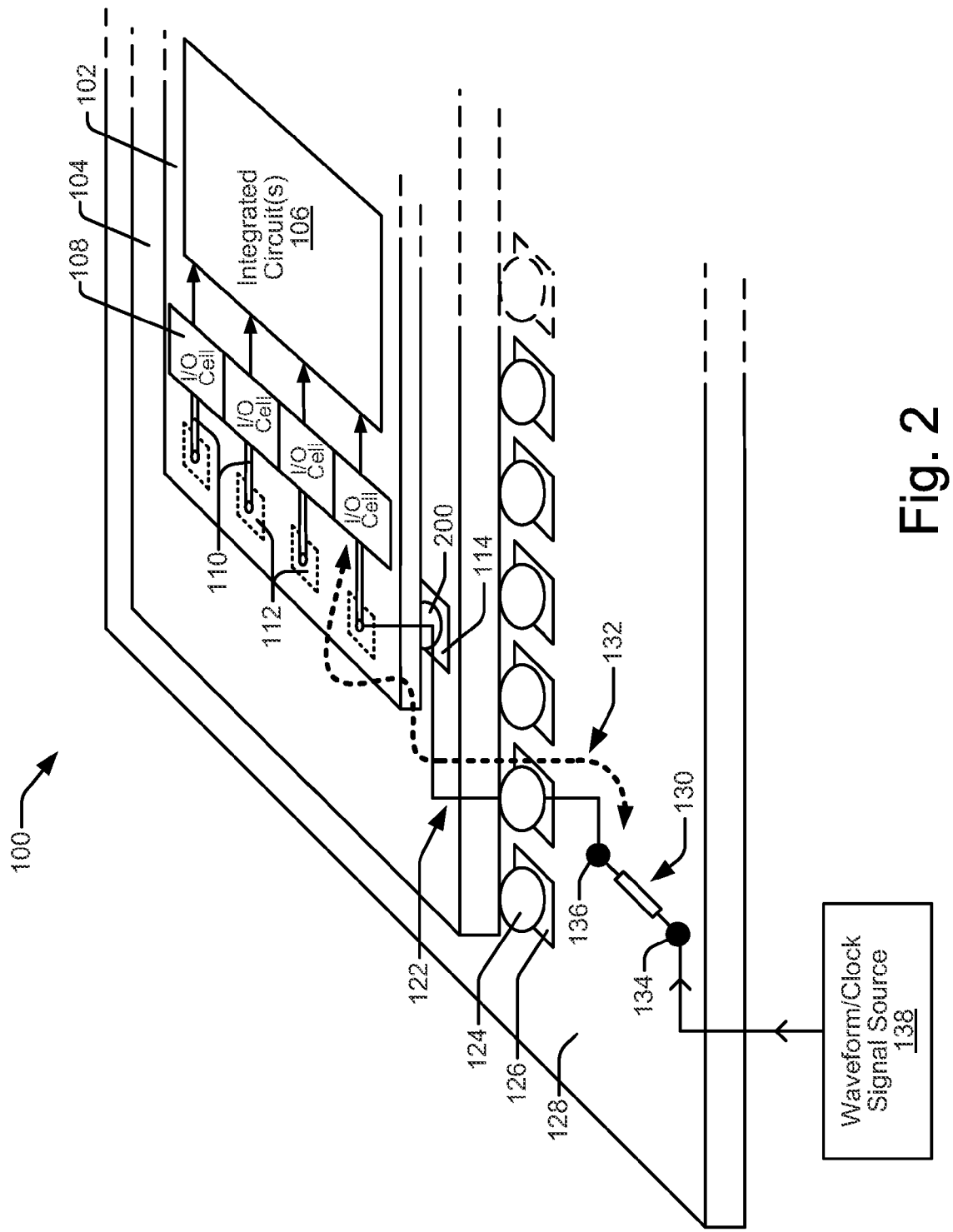
FIG. 2 shows an example of an active pin monitoring system according to another embodiment.

Active pins 110 are not necessarily pins in a conventional sense, such as the pins on a dual in-line IC package (DIP) or a pin grid array (PGA) package designed for through-hole or socket mounting to a printed circuit board. Rather, active pins 110 represent any electrically conductive connection to an I/O cell 108 and some functional aspect of a circuit 106 such as the active pins 110 in FIGS. 1 and 2 shown between die pads 112 and I/O cells 108. Thus, it is understood that active pins 110 may represent any manner or arrangement of pins available now or in the future for integrated circuit packaging, such as, for example, pins arranged in a single in-line package (SIP), a Dual in-line package (DIP), a zig-zag in-line package (ZIP), a pin grid array (PGA), a plastic pin grid array (PPGA), a flip-chip pin grid array (FCPGA), and the like.

Accordingly, in the present embodiment, active pins 110 couple each die pad 112 to input/output buffers, also called I/O cells 108. Each I/O cell 108 may form part of an integrated circuit 106 and each includes active I/O circuitry (not shown) for handling an input signal and/or output signal between a respective die pad 112 and an integrated circuit 106. I/O cells 108 are generally well modeled and known to have particular voltage/current characteristics as presented in the I/O Buffer Information Specification (IBIS). The IBIS presents the electrical characteristics (e.g., voltage/current behavior) of I/O cell designs without providing the detailed transistor and process information of the cell designs. Thus, the IBIS assists IC designers and simulation tool vendors in modeling compatible I/O cells.

In the embodiment shown in FIG. 1, each die pad 112 is further coupled through a bond wire 116 to a respective BGA pad 114 on BGA substrate 104. Wire bonding is a well-known and commonly used interconnect technology used to connect a die to a substrate to provide electrical paths for signal and power distribution to the die. Typically, a first bond, called a ball bond 118, is formed that attaches a small diameter bond wire (e.g., a gold wire) 116 to a die pad 112 through the use of heat and ultrasonic energy (i.e., thermosonic bonding). A second bond, called a stitch bond 120, is then formed that attaches the opposite end of the bond wire 116 to a BGA pad 114 on BGA substrate 104.

Each BGA pad 114 is electrically connected to a second corresponding BGA pad (not shown) on the opposite side or underside of BGA substrate 104 by a conductive track (e.g., track 122) and/or via that extends through the BGA substrate 104. Each second BGA pad (not shown) on the opposite side of BGA substrate 104 is connected to a printed circuit board (PCB) pad 126 through a solder ball 124 located on the opposite side of the BGA package substrate 104. The solder balls 124 thereby provide external electrical connection between the packaged IC die 102 and the PCB 128.

For each active pin 110 of IC die 102 intended to be monitored on active pin monitoring system 100, a series resistor 130 on PCB 128 is electrically coupled to a PCB pad 126 that is further electrically coupled to the active pin 110 and its corresponding I/O cell 108 through an electrically conductive path such as electrical path 132. Although a wide range of values for resistor 130 is acceptable, resistor 130 in the present embodiment has a value of 1 kilo-ohm. Pin 1 134 of resistor 130 is coupled to a waveform source 138 while pin 2 136 of resistor 130 forms a test point 136 and is coupled to a PCB pad 126. Waveform source 138 is typically located off of PCB 128 but in some embodiments might also be located in full or in part on PCB 128. A waveform such as a clock signal generated from source 138 and injected at pin 1 134 of resistor 130 travels to a corresponding I/O cell 108 on IC die 102 along an electrical/conductive path 132, unless there is a break in the path 132. Although the conductive path 132 indicates an active pin 110 coupled via a wire-bond and through a solder joint 124 that is not located at a corner of the BGA substrate 104, active pins 110 being monitored may be coupled through various solder joints 124 between the BGA substrate 104 and PCB 128, including those at the corners of the BGA substrate 104.

Referring now to FIG. 2, an active pin monitoring system 100 is implemented on a printed circuit assembly (PCA) in a manner similar to that shown in FIG. 1. Thus, in the system of FIG. 2, an IC die 102 is attached to a BGA substrate 104 and includes one or more integrated circuits 106, input/output (I/O) cells 108, and active pins 110. As noted above, an active pin 110 represents any electrically conductive connection to an I/O cell 108 and some functional aspect of a circuit 106 and may include any manner or arrangement of pins such as, pins arranged in a single in-line package (SIP), a Dual in-line package (DIP), a zig-zag in-line package (ZIP), a pin grid array (PGA), a plastic pin grid array (PPGA), a flip-chip pin grid array (FCPGA), and the like.

In the embodiment of FIG. 2, IC die 102 is configured as a flip-chip and is attached to BGA substrate 104 in a flip-chip configuration. IC die 102 in FIG. 2 is the same as that shown in FIG. 1 except that the die pads 112 are made more suitable for soldering to in the fabrication process. In the fabrication process of a flip-chip, solder bumps 200 are deposited onto the die pads 112 (initially on the top side of IC die 102) and are used to attach or bond the IC die 102 directly to a substrate such as BGA substrate 104. Because die pads 112 and solder bumps 200 are on the top side of IC die 102, the IC die 102 is flipped over and mounted to the BGA substrate 104 in a "face-down" manner. Solder bumps 200 couple die pads 112 to respective BGA pads 114 on BGA substrate 104, for example, through an ultrasonic or reflow solder process.

In other respects, the embodiment of FIG. 2 is the same or similar as the embodiment discussed with reference to FIG. 1. Accordingly, for each active pin 110 of IC die 102 intended to be monitored on active pin monitoring system 100, an electrically conductive path such as electrical path 132 is formed between pin 1 134 of resistor 130 and a corresponding I/O cell 108 on IC die 102. Again, although a wide range of values is acceptable, resistor 130 has a value of 1 kilo-ohm in the present embodiment. In addition, pin 1 134 of resistor 130 is coupled to a waveform source 138 which is typically located off of PCB 128. In some embodiments waveform source 138 might also be located in full or in part on PCB 128. In the embodiment of FIG. 2, a waveform such as a clock signal generated from source 138 and injected at pin 1 134 of resistor 130 travels through pin 2 136 (i.e., test point 136) to a corresponding I/O cell 108 on IC die 102 along an electrical path 132, unless there is a break in the path 132. Although the conductive path 132 indicates an active pin 110 coupled via a flip-chip-bond and through a solder joint 124 that is not located at a corner of the BGA substrate 104, active pins 110 being monitored may be coupled through various solder joints 124 between the BGA substrate 104 and PCB 128, including those at the corners of the BGA substrate 104.

Figure 3:
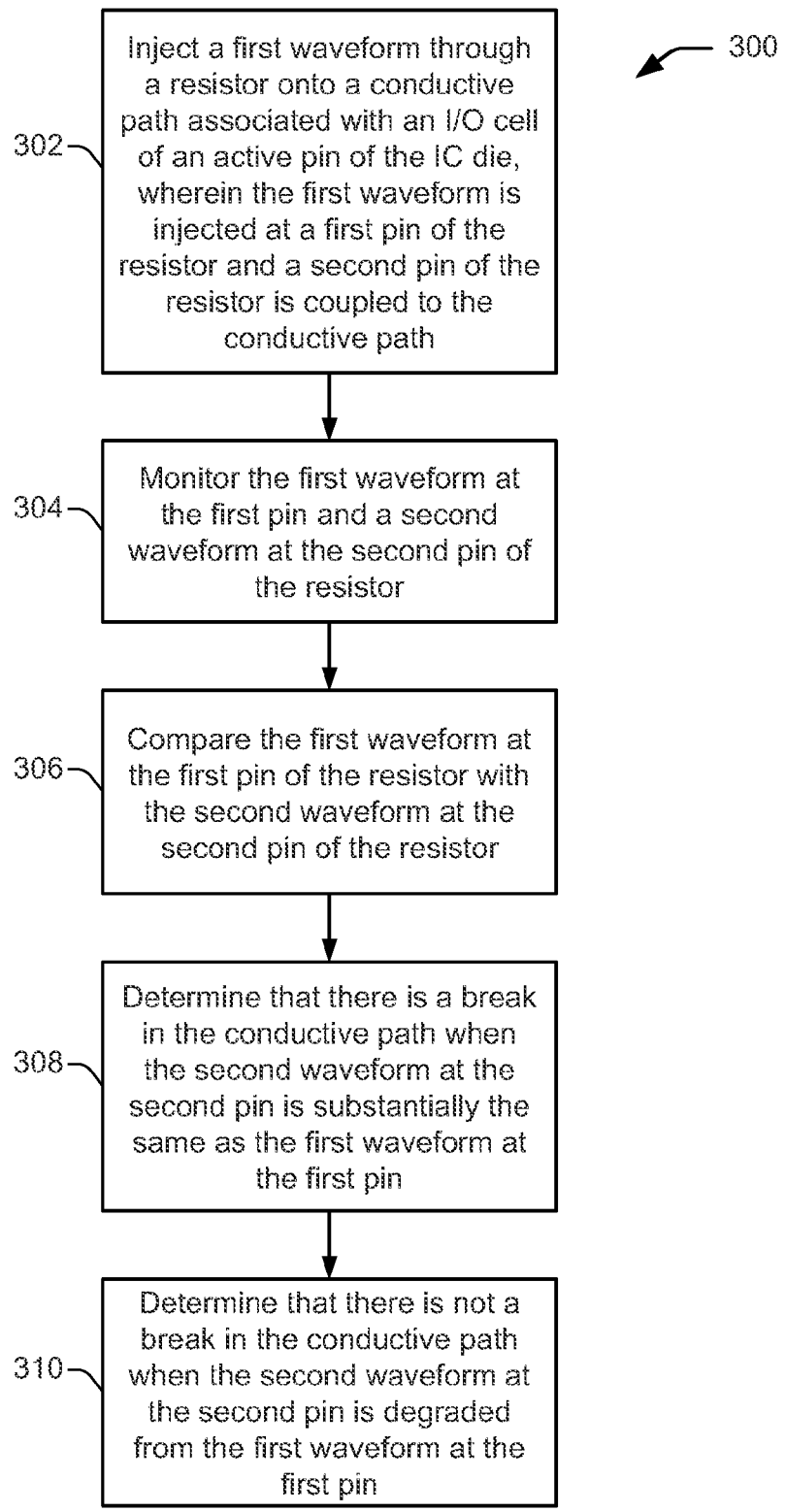
FIG. 3 shows a flowchart of a method of monitoring a connection to an active pin of an IC die according to an embodiment.
Figure 4:
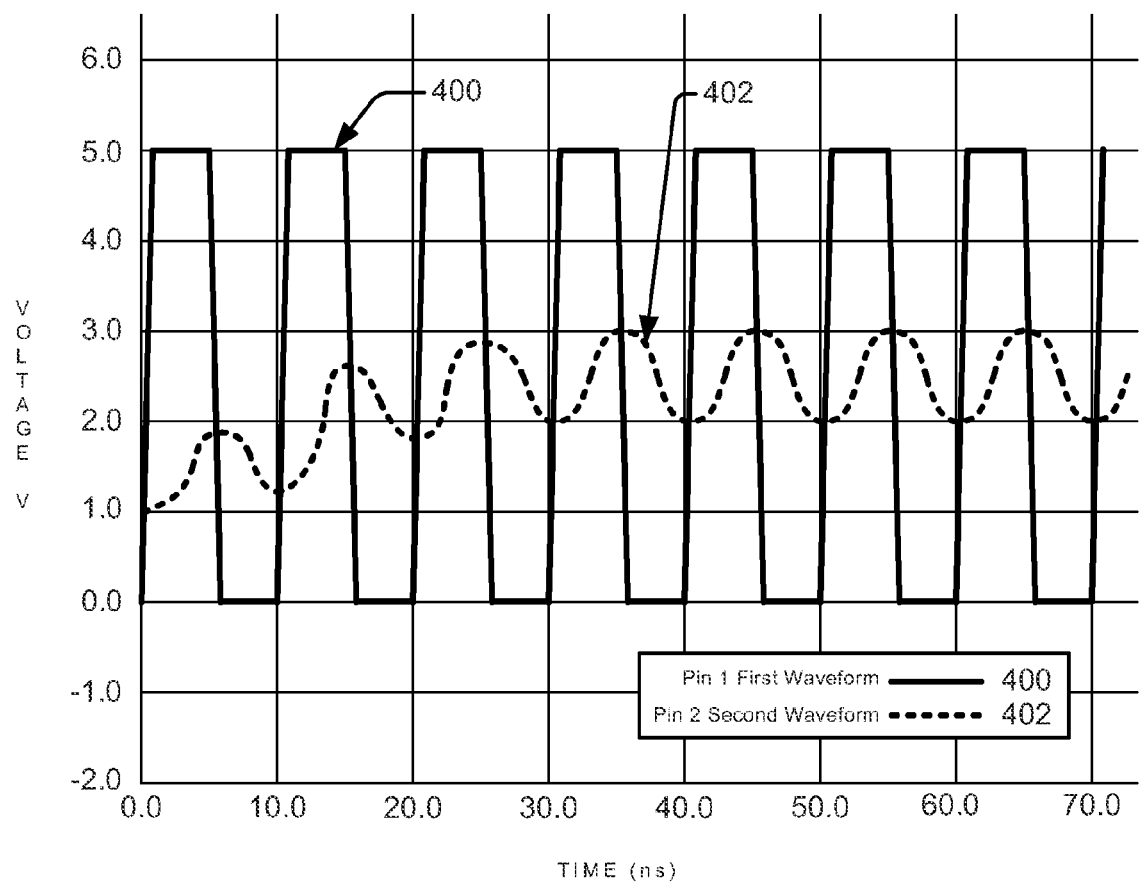
FIG. 4 shows an example of a comparison of waveforms being monitored in an active pin monitoring system according to an embodiment.
Figure 5:
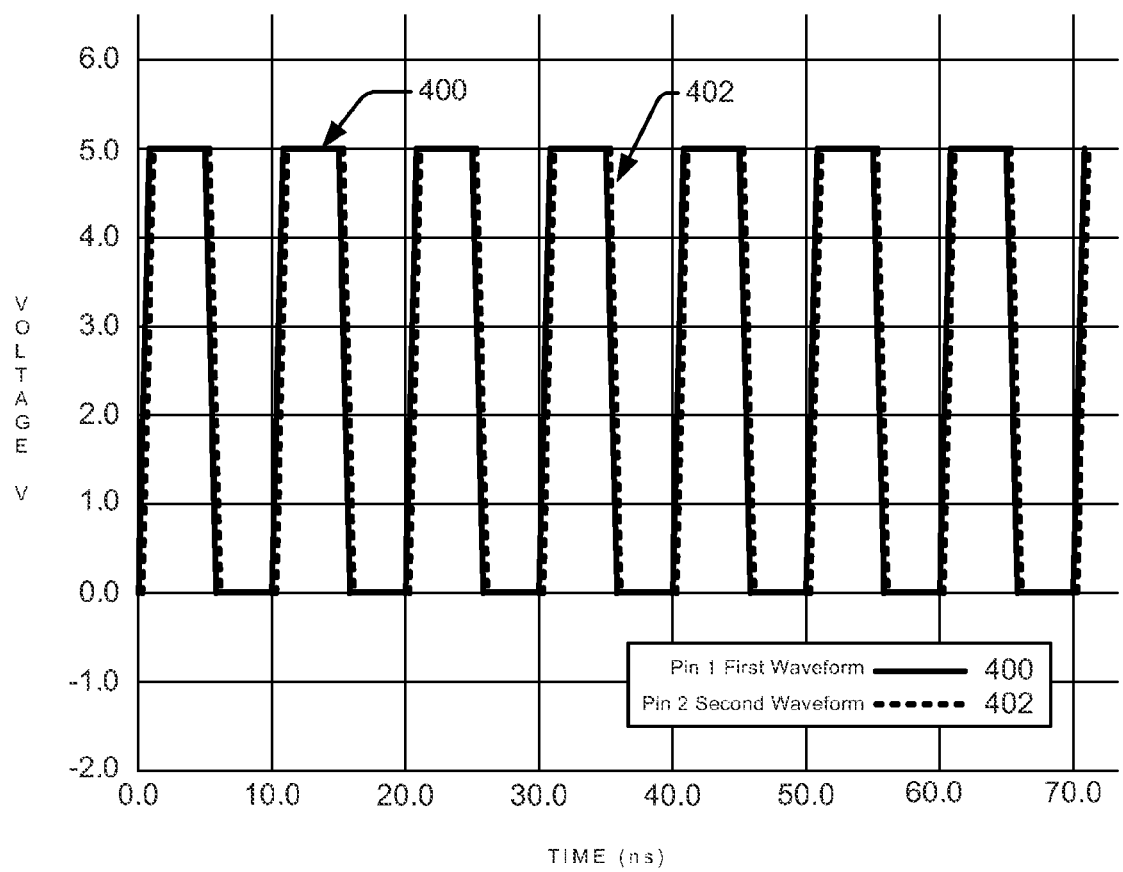
FIG. 5 shows another example of a comparison of waveforms being monitored in an active pin monitoring system according to an embodiment.

Referring primarily now to FIGS. 3-5, a method 300 of monitoring a connection to an active pin of an IC die will now be discussed. FIG. 3 shows a flowchart of method 300 according to an embodiment. The method 300 is generally associated with embodiments of the active pin monitoring system 100 discussed above with respect to FIGS. 1 and 2. As noted above, a waveform such as a clock signal generated from source 138 and injected at pin 1 134 of resistor 130 travels to a corresponding I/O cell 108 on IC die 102 along an electrical path 132, unless there is a break in the path 132. The method 300 of monitoring a connection to an active pin 110 is performed by monitoring signals along the electrical path 132 (i.e., at test point 136) to determine if there is a break in the electrical path 132.

Method 300 begins at block 302 with injecting a first waveform such as a clock signal through a resistor 130 onto a conductive path 132 associated with an I/O cell 108 of an active pin 110 of an IC die 102. The first waveform is injected at a first pin 134 of the resistor 130, resulting in a second waveform at a second pin 136 (i.e., test point 136) of the resistor coupled to the conductive path. A suitable first waveform 400 to be injected at pin 1 134 of resistor 130 is shown in FIG. 4 as a clock signal having an amplitude of 5 volts and a frequency of 100 megahertz. However, as discussed further below, the amplitude and frequency of the first waveform 400 can vary significantly without hindering the method of monitoring the connection to the active pin 110.

Method 300 continues at block 304 with monitoring the first waveform 400 at the first pin of resistor 130 and a second waveform 402 (FIGS. 4 and 5) at the second pin of resistor 130. FIGS. 4 and 5 show examples of waveforms 400 and 402 being monitored at pin 1 134 and pin 2 136 of resistor 130, respectively. As previously noted, the first waveform 400 is injected at pin 1 134 of resistor 130 resulting in a second waveform 402 present at pin 2 136 of resistor 130. Thus, at block 304 of method 300, the waveforms 400 and 402 are monitored. At block 306, the monitored waveforms 400 and 402 at the first and second pins of resistor 130 are compared to one another. FIGS. 4 and 5 further provide examples of a comparison of the monitored waveforms 400 and 402 at pin 1 134 and pin 2 136 of resistor 130.

At block 308, it is determined from the comparison of waveforms 400 and 402 that there is a break in the conductive path 132 when the second waveform 402 at pin 2 136 of resistor 130 is substantially the same as the first waveform 400 injected at pin 1 134 of resistor 130. FIG. 5 shows an example of a comparison of waveforms 400 and 402 which illustrates that the second waveform 402 is substantially the same as the first waveform 400. As shown in the FIG. 5 example, the waveform 400 injected at pin 1 134 of resistor 130 has a voltage amplitude of 5 volts and a frequency of 100 megahertz. In addition, the resulting waveform 402 at pin 2 136 of resistor 130 appears to be substantially on top of waveform 400 and has a voltage amplitude of 5 volts and a frequency of 100 megahertz. Thus, waveforms 400 and 402 in FIG. 5 are at least substantially the same. Accordingly, the waveforms 400 and 402 illustrated in FIG. 5 show a scenario in which the block 308 determination would be that there is a break in the conductive path 132, which indicates that the connection to the monitored active pin 110 of IC die 102 is likewise broken, or defective.

When a determination is made that there is a break in the conductive path 132, it should be noted that the break could be anywhere along the conductive path 132. Although it is more likely the break would occur at a solder ball joint 124 between the PCB 128 and BGA substrate 104, the break might also occur in any number of other locations along conductive path 132. For example, a break detected along a conductive path 132 might also occur at a wire-bond joint 116, 118, 120 (FIG. 1), a solder bump 200 connection in a flip-chip mounted IC die 102 (FIG. 2), any portion of conductive track on the BGA substrate 104 or PCB 128 such as a conductive track 122, or the like. Thus, in determining a break in a conductive path 132, the method 300 of monitoring a connection to an active pin of an IC die will detect such a break or failure anywhere along that path.

The method 300 continues at block 310, where it is determined from the comparison of waveforms 400 and 402 that there is no break in the conductive path 132 when the second waveform 402 at pin 2 136 of resistor 130 is not substantially the same as the first waveform 400 injected at pin 1 134 of resistor 130. FIG. 4 shows an example of a comparison of waveforms 400 and 402 which illustrates that the second waveform 402 is not substantially the same as the first waveform 400. As shown in the FIG. 4 example, the waveform 400 injected at pin 1 134 of resistor 130 has a voltage amplitude of 5 volts and a frequency of 100 megahertz. However, the resulting waveform 402 at pin 2 136 of resistor 130 is substantially degraded with respect to waveform 400, and has a significantly lower voltage amplitude. Thus, waveforms 400 and 402 in FIG. 4 vary significantly, at least in amplitude, and typically in form as well. Accordingly, the waveforms 400 and 402 illustrated in FIG. 4 show a scenario in which the block 308 determination would be that there is not a break in the conductive path 132, which indicates that the connection to the monitored active pin 110 of IC die 102 is complete and intact.

Figure 6:
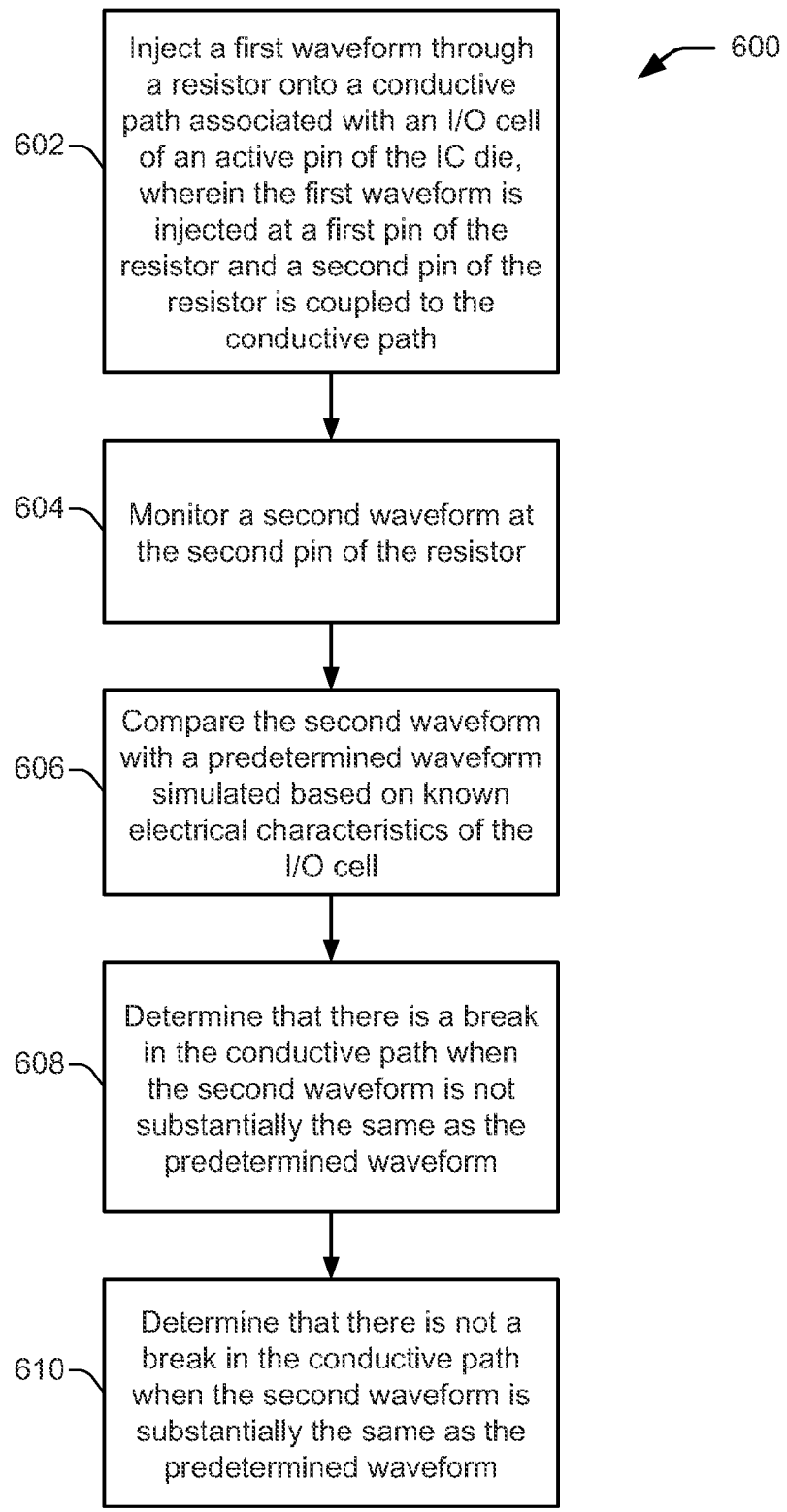
FIG. 6 shows a flowchart of a method of monitoring a connection to an active pin of an IC die according to an embodiment.

The characteristics of a degraded waveform at pin 2 136 of resistor 130 (e.g., waveform 402 of FIG. 4) are mostly the result of electrical interaction with the I/O cell 108 whose voltage/current characteristics are known. As noted above, the IBIS makes the electrical characteristics (e.g., voltage/current behavior) of various I/O cells known and thereby enables modeling I/O cells in IC design applications. In addition, the known I/O cell characteristics enable the simulation of a second waveform at pin 2 136 of resistor 130 in the present active pin monitoring system 100 and methods 300, 600 (FIG. 6). That is, given the known electrical characteristics of I/O cell 108, the appearance and other characteristics of a (degraded) waveform at pin 2 136 of resistor 130 can be simulated and generated.

The characteristics of a waveform at pin 2 136 of resistor 130 are also affected to a lesser degree by the value of resistor 130. For example, a larger value of resistor 130 tends to further reduce the amplitude of the waveform at pin 2 136 when there is no break in the conductive path 132 to I/O cell 108. Thus, although the value of resistor 130 is shown herein as 1 Kohm, other values are possible, and a second waveform at pin 2 136 of resistor 130 can be readily simulated based on the characteristics of the waveform injected at pin 1 of resistor 130, the characteristics of the I/O cell 108, and the value of resistor 130. However, it is noted that for a wide range of values of resistor 130, a degraded waveform at pin 2 136 of resistor 130 is easily determined when there is no break in the conductive path 132. Thus, the active pin monitoring system 100 and methods 300, 600 (FIG. 6) provide a ready determination of whether or not there is a break in a conductive path 132 and whether the connection to a monitored active pin 110 of an IC die 102 is intact.

As noted above, although the frequency of the waveform injected at pin 1 134 of resistor 130 is shown herein as 100 megahertz, the frequency can vary widely without hindering the ability of the active pin monitoring system 100 and methods 300, 600 (FIG. 6) from determining whether or not there is a break in a conductive path 132, and thus whether the connection to a monitored active pin 110 of an IC die 102 is intact. In the present disclosure, a motherboard of a personal computer is the environment in which the system 100 and methods 300, 600 are contemplated. However, various other applications are possible, and a frequency of 100 megahertz would work well in most. In general, depending on the clock frequency of the IC die being monitored, a non-limiting range of 10 megahertz to 200 megahertz is suitable for most applications.

Referring now primarily now to FIG. 6, another method 600 of monitoring a connection to an active pin of an IC die will be discussed. FIG. 6 shows a flowchart of method 600 according to an embodiment. The method 600 is generally associated with embodiments of the active pin monitoring system 100 discussed above with respect to FIGS. 1 and 2. Method 600 begins at block 602 with injecting a first waveform such as a clock signal through a resistor 130 onto a conductive path 132 associated with an I/O cell 108 of an active pin 110 of an IC die 102. The first waveform is injected at a first pin 134 of the resistor 130, resulting in a second waveform at a second pin 136 of the resistor coupled to the conductive path.

Method 600 continues at block 604 with monitoring the second waveform (e.g., waveform 402, FIGS. 4 and 5) at the second pin 136 of resistor 130. At block 606, the monitored waveform 402 at the second pin 136 of resistor 130 is compared to a predetermined waveform simulated according to known electrical characteristics of I/O cell 108, as discussed herein above. At block 608, it is determined from the comparison of the predetermined waveform and waveform 402 at the second pin 136 of resistor 130 that there is a break in the conductive path 132 when waveform 402 at the second pin 136 is not substantially the same as the predetermined waveform. Thus, in this circumstance, it is known that the connection to a monitored active pin 110 of an IC die 102 is broken or not intact because the waveform at the second pin 136 of resistor 130 does not possess the same degraded characteristics as would be expected (i.e., as would appear in a simulated waveform) from electrical interaction with the I/O cell 108.

The method 600 continues at block 610, where it is determined from the comparison of the predetermined waveform and waveform 402 at the second pin 136 of resistor 130 that there is no break in the conductive path 132 when the second waveform 402 at pin 2 136 of resistor 130 is substantially the same as the predetermined waveform. Thus, in this circumstance, it is known that the connection to a monitored active pin 110 of an IC die 102 is not broken (i.e., is intact) because the waveform at the second pin 136 of resistor 130 possesses the same degraded characteristics as would be expected (i.e., as would appear in a simulated waveform) from electrical interaction with the I/O cell 108.

What is claimed is:

1. A method of monitoring a connection to an active pin of an integrated circuit (IC) die comprising:
    injecting a first waveform through a resistor onto a conductive path associated with an input/output (I/O) cell of an active pin of an IC die, wherein the first waveform is injected at a first pin of the resistor and a second pin of the resistor is coupled to the conductive path;
    monitoring the first waveform at the first pin and a second waveform at the second pin;
    comparing the first waveform at the first pin with the second waveform at the second pin; and
    determining that there is a break in the conductive path when the second waveform at the second pin is substantially the same as the first waveform at the first pin.

2. A method as recited in claim 1, further comprising determining that there is not a break in the conductive path when the second waveform at the second pin is degraded from the first waveform at the first pin.

3. A method as recited in claim 2, wherein determining that there is not a break in the conductive path comprises determining that the second waveform at the second pin substantially matches a predetermined waveform simulated according to known electrical characteristics of the I/O cell.

4. A method as recited in claim 1, wherein the injecting a first waveform comprises injecting a clock signal having a frequency of 100 megahertz and an amplitude of 5 volts.

5. A method as recited in claim 1, wherein the IC die is wire-bonded to a ball grid array (BGA) substrate and the active pin is coupled to the conductive path through a solder joint located at a corner of the BGA substrate between the BGA substrate and a printed circuit board.

6. A method as recited in claim 1, wherein the IC die is flip-chip-bonded to a ball grid array (BGA) substrate and the active pin is coupled to the conductive path through a solder joint located at a corner of the BGA between the BGA and a printed circuit board.

7. A method of monitoring a connection to an active pin of an integrated circuit (IC) die comprising:
    injecting a first waveform through a resistor onto a conductive path associated with an input/output (I/O) cell of an active pin of an IC die, wherein the first waveform is injected at a first pin of the resistor and a second pin of the resistor is coupled to the conductive path;
    monitoring a second waveform at the second pin of the resistor;
    comparing the second waveform at the second pin to a predetermined waveform simulated according to known electrical characteristics of the I/O cell; and
    determining that there is a break in the conductive path when the second waveform at the second pin is not substantially the same as the predetermined waveform.

8. A method as recited in claim 7, wherein the predetermined waveform is a simulated waveform based on known electrical characteristics of the I/O cell, a known value of the resistor, and characteristics of the first waveform.

9. A method as recited in claim 7, further comprising determining that there is not a break in the conductive path when the second waveform at the second pin is substantially the same as the predetermined waveform.

10. A method as recited in claim 7, wherein the predetermined waveform represents a degraded version of the first waveform injected at the first pin.

11. A method as recited in claim 7, further comprising simulating the predetermined waveform based on known electrical characteristics of the I/O cell, a known value of the resistor, and characteristics of the first waveform.

12. A system for monitoring a connection to an active pin of an integrated circuit (IC) die, comprising:
   an input/output (I/O) cell of an IC die, the I/O cell bonded to a bonding pad on a ball grid array (BGA) substrate;
   a test point on a printed circuit board (PCB) coupled to the bonding pad and forming an electrical connection pathway between the test point and the I/O cell; and
   a first waveform injected through a resistor into the test point,
   wherein a break in the electrical connection pathway is determined when a second waveform at the test point is substantially the same as the first waveform.

13. The system of claim 12, wherein the bond between the I/O cell and the bonding pad is a wire bond.

14. The system of claim 12, wherein the IC die is flip-chip bonded to the BGA substrate and the bond between the I/O cell and the bonding pad is a solder joint.

15. The system of claim 12, wherein the resistor is approximately 1 kilo-ohm and the first waveform comprises a clock waveform having a frequency of approximately 100 megahertz.

16. The system of claim 12, wherein no break in the electrical connection pathway is determined when the second waveform at the test point is degraded from the first waveform.

17. The system of claim 12, wherein no break in the electrical connection pathway is determined when the second waveform at the test point substantially matches a predetermined waveform simulated according to known electrical characteristics of the I/O cell.

* * * * *